United States Patent [19]

Weiss

[11] Patent Number: 4,990,799
[45] Date of Patent: Feb. 5, 1991

[54] LOW-HYSTERESIS REGENERATIVE COMPARATOR

[76] Inventor: Frederick G. Weiss, 17810 NE. Courtney Rd., Newberg, Oreg. 97132

[21] Appl. No.: 457,121

[22] Filed: Dec. 26, 1989

[51] Int. Cl.[5] .................. H03K 3/26; H03K 3/29; H03K 5/153; H03F 3/45
[52] U.S. Cl. .................. 307/355; 307/530; 307/279; 307/362
[58] Field of Search .............. 307/350, 362, 530, 279, 307/352, 355, 289, 290

[56] References Cited

U.S. PATENT DOCUMENTS

| | | | |
|---|---|---|---|
| 4,121,120 | 10/1978 | Wetterling | 307/352 |
| 4,418,402 | 11/1983 | Heagerty et al. | 307/279 |
| 4,439,694 | 3/1984 | Fox | 307/362 |
| 4,629,911 | 12/1986 | Bebernes et al. | 307/362 |
| 4,656,371 | 4/1987 | Binet et al. | 307/530 |

OTHER PUBLICATIONS

P/O Trigger Board A2 on pp. 7–13 of the Preliminary Manual Hewlett Packard Model 8091A Generator Module Operating and Service Manual, and cover sheet for the Operating and Service Manual.
Giles and Seales, "A New High-Speed Comparator the Am685," Advanced Micro Devices Analog and Communication Product Databook, 1983, pp. 2–42 to 2–50.
Ducourant, et al., "3 GHz, 150 mW, 4 bit GaAs Analogue to Digital Converter," 1986 GaAs IC Symposium, pp. 209–212.
Ducourant, et al., "N–On Versus N–Off GaAs MESFET's for an Ultra High Speed Comparator," 11th International Conference on GaAs and Related Compounds, Biarritz, France 26–28 Sep. 1984, pp. 1–6.

Primary Examiner—Stanley D. Miller
Assistant Examiner—Yen Nguyen
Attorney, Agent, or Firm—Alan K. Aldous; Peter J. Meza

[57] ABSTRACT

A regenerative comparator with a differential amplifier pair of transistors ($Q_{1D}$, $Q_{1E}$, $Q_{2D}$, and $Q_{2E}$) and a differential regenerative pair of transistors ($Q_{3D}$, $Q_{3E}$, $Q_{4D}$, and $Q_{4E}$), utilizes one or more of the following three techniques to reduce hysteresis by reducing the amount of charge storage in transistors. First, the transistors are arranged in a bootstrap cascode configuration having a depletion mode device ($Q_D$) and an enhancement mode device ($Q_E$). Second, a differential amplifier pair source-coupling implementation ($D_1$–$D_4$, $Q_{5A}$–$Q_{5C}$, and $Q_{6A}$–$Q_{6C}$) allows current to flow through the transistors of the differential amplifier pair and differential regenerative pair independent of whether current is flowing through the branch (52 or 4) that connects the emitters or sources of the enhancement devices of the amplifier pair and regenerative pair. Third, the comparator includes keep-alive current sources ($Q_{KA1}$–$Q_{KA4}$) that allow current to flow through the amplifier pair and regenerative pair independent of the magnitude of the difference in gate input voltages being compared.

21 Claims, 6 Drawing Sheets

LOW-HYSTERESIS REGENERATIVE COMPARATOR

FIELD OF THE INVENTION

The present invention relates to electric signal comparators and, in particular, to a low-hysteresis regenerative comparator wherein the impact of MESFET charge storage is minimized.

BACKGROUND OF THE INVENTION

Because of their inherent material properties, gallium arsenide (GaAs) metal semiconductor field effect transistor (MESFET) devices exhibit charge storage effects which manifest themselves as time- and level-dependent hysteresis in circuits that employ MESFETs as amplifying and/or switching elements. Various techniques have been used to overcome or minimize these effects, including autozeroing and cascoding. Autozeroing is very effective, but has the disadvantage of requiring additional circuitry which, in general, precludes such circuits from use in flash analog-to-digital (A/D) converters having on the order of $2^N$ comparators, where N is the number of bits of resolution.

FIG. 1 illustrates a basic prior art regenerative comparator circuit 10 implemented in silicon bipolar technology, and FIG. 2 shows an analogous GaAs MESFET implementation in circuit 20. Circuits 10 and 20 include inputs $V_{IN+}$ and $V_{IN-}$, and outputs $V_{OUT}$ and $NV_{OUT}$. In one use of circuits 10 and 20, $V_{IN+}$ may receive a reference voltage and $V_{IN-}$ may receive a voltage that is to be compared to the reference voltage. In one use of circuits 10 and 20 during a regenerative period, $V_{OUT}$ is in a high state and $NV_{OUT}$ is in a low state when $V_{IN+}$ is greater than $V_{IN-}$. Conversely, $V_{OUT}$ is in a low state and $NV_{OUT}$ is in a high state when $V_{IN+}$ is less than $V_{IN-}$.

Circuits 10 and 20 include an outer differential amplifier pair ($Q_1$, $Q_2$), a differential inner latching or regenerative pair ($Q_3$, $Q_4$), and a third differential amplifier pair ($Q_5$, $Q_6$), driven by a clock signal CLK and inverted clock signal NCLK. CLK and NCLK originate from an externally applied strobe clock.

The third differential pair ($Q_5$, $Q_6$) provide a path through which current from a current source $Q_7$ can flow from the emitters of the outer differential amplifier pair ($Q_1$, $Q_2$) whenever CLK is in a high state and NCLK is in a low state, and the inner regenerative pair ($Q_3$, $Q_4$) whenever CLK is in a low and NCLK is in a high state.

Whenever CLK is high, the outer differential pair ($Q_1$, $Q_2$) acts as an amplifier on the voltage difference between inputs $V_{IN+}$ and $V_{IN-}$ setting up a voltage offset at the complementary output terminals $V_{OUT}$ and $NV_{OUT}$ and charging the parasitic capacitances $C_P$ and $NC_P$ connected to the collector or drain nodes. When CLK switches low, current is steered to the inner regenerative pair ($Q_3$, $Q_4$), thereby beginning the regeneration cycle.

The offset stored on $C_P$ and $NC_P$ serves to unbalance the output voltage of the inner regenerative pair ($Q_3$, $Q_4$), and the offset then grows exponentially because of the cross-coupled nature of the inner regenerative pair ($Q_3$, $Q_4$). The ultimate magnitude of the output voltage difference between $V_{OUT}$ and $NV_{OUT}$ is set by the tail current-$I_7$ flowing through the collector or drain of $Q_7$ and the values of the load resistors $R_{L1}$, $R_{L2}$. When the clock again switches high, the inner regenerative pair ($Q_3$, $Q_4$) is disabled and the outer differential pair ($Q_1$, $Q_2$) is reactivated, and circuit 10 recovers to its original state, wherein the values of $V_{OUT}$ and $NV_{OUT}$ are directly influenced by the values of $V_{in+}$ and $V_{in-}$. Transistors $Q_8$-$Q_{11}$, and diodes $D_{8a-i}$ and $D_{9a-i}$ provide level-shifting and output drive capability.

FIGS. 3a, 3b, and 3c show typical waveforms for circuits 10 and 20 of FIGS. 1 and 2. FIG. 3a shows the voltage of $V_{IN+}$ as it changes with time while $V_{IN-}$ (the dashed line) is held constant FIG. 3b shows CLK changing from a high state during the amplification period to a low state during the regenerative period, to a high state again during the amplification period. Referring to FIG. 3c, whenever CLK is in a high state, the difference in the values of the outputs $V_{OUT}$ and $NV_{OUT}$ is determined by the relative values of $V_{IN+}$ and $V_{IN-}$, shown here as constant values for clarity only. Whenever CLK is in a state low state and NCLK is in a high state, the difference in the output values changes until a maximum is reached when all of the current is flowing through one of the inner transistors $Q_3$ or Q. When CLK is changed to a high state again, the outputs rapidly change to new values determined by the values of $V_{IN+}$ and $V_{IN-}$ after CLK changes state.

Silicon transistors are free of anomalous charge storage effects, and any hysteresis resulting from charge stored in the junctions and parasitic capacitances tends to manifest itself at high frequencies. On the other hand, GaAs transistors contain defects and traps in the crystal which exhibit charge storage effects with very long (microsecond to millisecond) time constants.

These charge storage effects manifest themselves as low-frequency, frequency-dependent drain conductance and transconductance within field effect transistors (FETs), leading to long-time constant hysteresis in amplifiers and comparators, and even in logic gates. The presence of hysteresis decreases the ability of the circuit to respond properly to small signals, thus limiting the degree of resolution achievable in comparators and amplifiers.

There is a need, therefore, for techniques that minimize the impact of MESFET charge storage and allow increased resolution and operating speed in comparators and amplifiers. There also is a need for a low-hysteresis high-speed regenerative comparator suitable for use in A/D converters that use large numbers of comparators.

SUMMARY OF THE INVENTION

It is, therefore, an object of this invention to provide techniques that minimize the impact of MESFET charge storage.

It is also an object of this invention to provide techniques that allow increased resolution and operating speed in comparators and amplifiers.

In the present invention, a regenerative comparator with a differential amplifier pair of transistors and a differential regenerative pair of transistors, utilizes one or more of the following three techniques to reduce hysteresis by reducing the amount of charge storage in transistors. First, the transistors are arranged in a bootstrap cascode configuration having a depletion mode device and an enhancement mode device. Second, a differential amplifier pair source-coupling implementation allows current to flow through the transistors of the differential amplifier pair and differential regenerative pair independent of whether current is flowing through the branch that connects the emitters or sources of the enhancement devices of the amplifier pair and regenerative pair. Third, the comparator includes keep-alive current sources that allow current to flow through the amplifier pair and regenerative pair independent of the magnitude of the difference between the gate input voltages being compared by the outer differential amplifier pair, and by the inner differential regenerative pair.

DETAILED DESCRIPTION OF PREFERRED EMBODIMENT

A premise underlying this invention is that the smaller the variation in FET bias conditions during the different comparator states of amplification and regeneration, or switching between the states, the smaller will be the hysteresis. In the present invention, various techniques are employed in the design of the comparator.

Figure 4:
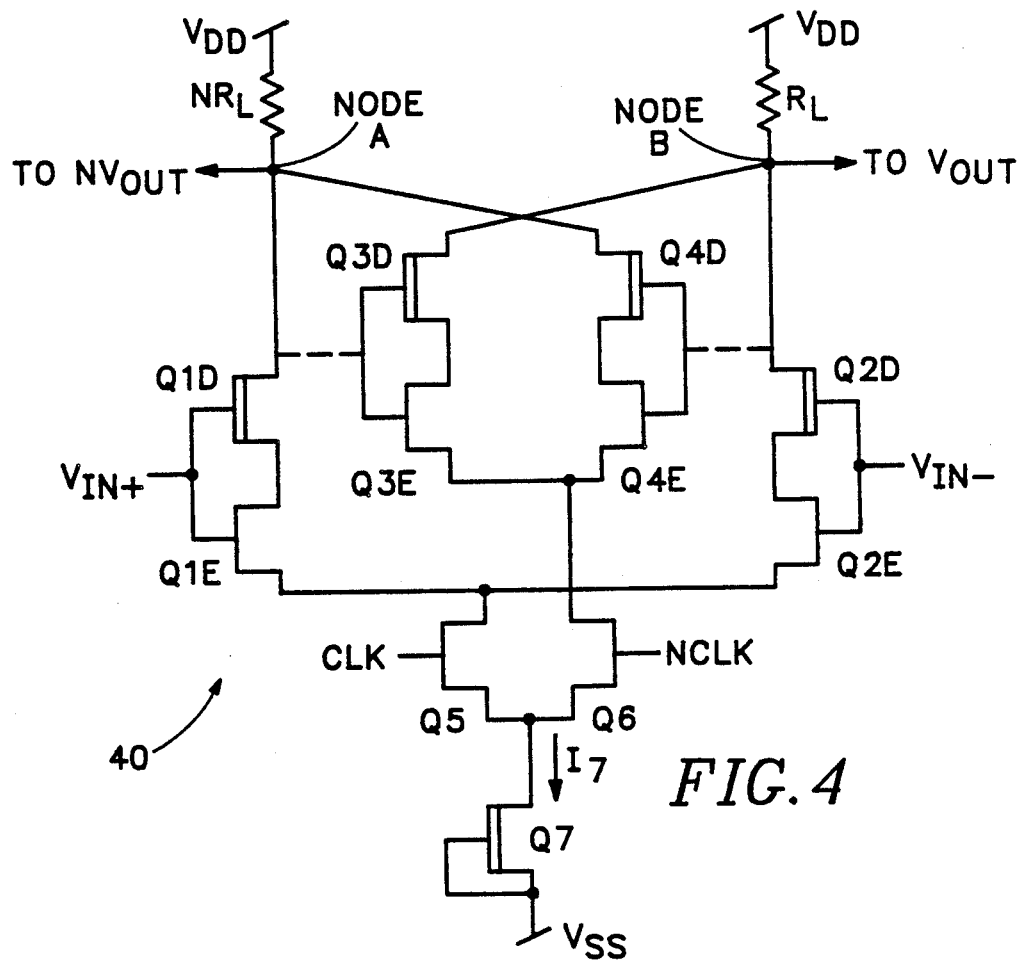
FIG. 4 shows a circuit that incorporates a bootstrap cascode topology of the present invention.

Each of these techniques serves to reduce variations in the drain-to-source and gate-to-source voltage, and the drain to source current, of the outer (amplifier) or inner (latching) differential pairs of transistors. As used herein unless stated otherwise, the phrase "current through a transistor" means current from the drain to the source or from the collector to the emitter. One or more of three primary circuit topologies are used to achieve the minimization. The first topology, which is shown in circuit 40 of FIG. 4, is bootstrap cascoding of both amplifier and regenerative FETs. Referring to FIG. 4, the bootstrap cascode transistor pairs include an enhancement device $Q_{1E}$, $Q_{2E}$, $Q_{3E}$, and $Q_{4E}$ and an associated bootstrap cascode depletion device $Q_{1D}$, $Q_{2D}$, $Q_{3D}$, and $Q_{4D}$. Enhancement and depletion type transistor devices are identified by reference numeral subscripts followed by the respective suffices "E" and "D." The enhancement and depletion devices are sometimes collectively referred to as "$Q_D$" and "$Q_E$", respectively. As used herein, bootstrap describes the ability of the circuit topology to cause the voltages at the drain and source of $Q_E$ to follow the voltage present at the common gate of $Q_D$ and $Q_E$ in such a way as to maintain the drain-to-source voltage of $Q_E$ at nearly a constant voltage.

Examples of the enhancement and depletion devices include junction field effect transistors (JFET), metal oxide semiconductor field effect transistors (MOSFET), and MESFET transistors. A bipolar junction transistor (BJT) may be used in place of an enhancement FET device in this topology in combination with a depletion mode JFET, MOSFET, or MESFET device.

The bootstrap cascode topology is illustrated by transistors $Q_{1D}$, $Q_{2D}$, $Q_{3D}$, and $Q_{4D}$, which are depletion devices with $V_{PD}$ (the FET pinch off voltage) equal to approximately $-0.5$ v in one embodiment of the invention. The bootstrap cascode topology also includes $Q_{1E}$, $Q_{2E}$, $Q_{3E}$, and $Q_{4E}$, which are enhancement devices with $V_{PE}$ equal to approximately $+0.3$ v in one embodiment. The appropriate use of a depletion-mode cascode removes the need for an additional level-shifting or cascode gate bias circuit to establish the described value $V_{DS}$ for $Q_E$.

Dimensional values of $Q_D$ and $Q_E$ are chosen to achieve proper operation. For an FET transistor, the dimension value is the gate width. For a BJT transistor, the dimension value is the emitter size. The proper choice of the gate width of the depletion mode cascode $Q_D$ and the gate width or emitter size of the enhancement-mode transistor $Q_E$ will result in a substantially constant optimum drain-to-source voltage $V_{DS}$ of $Q_E$ over all operating conditions.

An approach for choosing the respective gate widths of $Q_D$ and $Q_E$ is explained as follows. First, the bias point of $Q_E$ is chosen to provide the desired voltage gain, $A_V$, under quiescent conditions At this bias point, $Q_E$ operates above the knee in the drain source current characteristics, with $V_{DS}$ equal to approximately 0.7 v and $V_{GS}$ equal to approximately 0.6 v for the case of $V_{PE} = +0.3$ v. Note that it is preferable that the drain-to-source bias across $Q_E$ be kept below a value which enhances charge storage, i.e., less than about 1.5 volts for a typical MESFET.

After the bias of $Q_E$ is chosen, the gate width of $Q_D$ is chosen to give the desired value of $V_{DS}$ for $Q_E$. To obtain the desired value of $V_{DS}$ for $Q_E$, the gate-to-source voltage $V_{GS}$ for $Q_D$ is chosen to be less than zero so that the source voltage is higher than the gate voltage. Therefore, the voltage at the drain of $Q_E$ is higher than the voltage at the gate of $Q_E$. By choosing a proper combination of widths for $Q_D$ and $Q_E$, $Q_D$ attenuates changes in $V_{OUT}$ and $NV_{OUT}$, thus isolating $V_{DS}$ of $Q_E$ from changes in $V_{OUT}$. The bootstrap cascode topology thereby reduces the amount of charge storage and resulting hysteresis by minimizing changes in the operating point of $Q_E$.

The gate terminals of $Q_{1D}$ and $Q_{1E}$, and $Q_{2D}$ and $Q_{2E}$ are connected to $V_{IN+}$ and $V_{IN-}$, respectively. The drain terminals of $Q_{3D}$ and $Q_{4D}$ are connected to $V_{OUT}$ and $NV_{OUT}$, respectively. The level shift subcircuits that include $Q_8$, $D_{8a-1}$, and $Q_{10}$, and $Q_9$, $D_{9a-1}$, and $Q_{11}$ shown in FIGS. 1 and 2 have been omitted from FIGS. 4, 5 and 6 for purposes of clarity. The dashed lines in between the gate of $Q_3$ and node A, and the gate of $Q_4$ and node B represent the level shift subcircuits. The circuit of FIGS. 4, 5, 6 and 7 operate in an amplify and a regenerative mode while CLK is high and low, respectively, in the manner previously discussed in connection with the circuits of FIGS. 1 and 2.

The bootstrap cascode, topology shown in FIG. 4 is implemented in the circuits described below in connection with FIGS. 5–8. Node A and node B are identified in FIGS. 1–2 and 4–8 to show the relationship among the circuits depicted in these figures.

Figure 5:
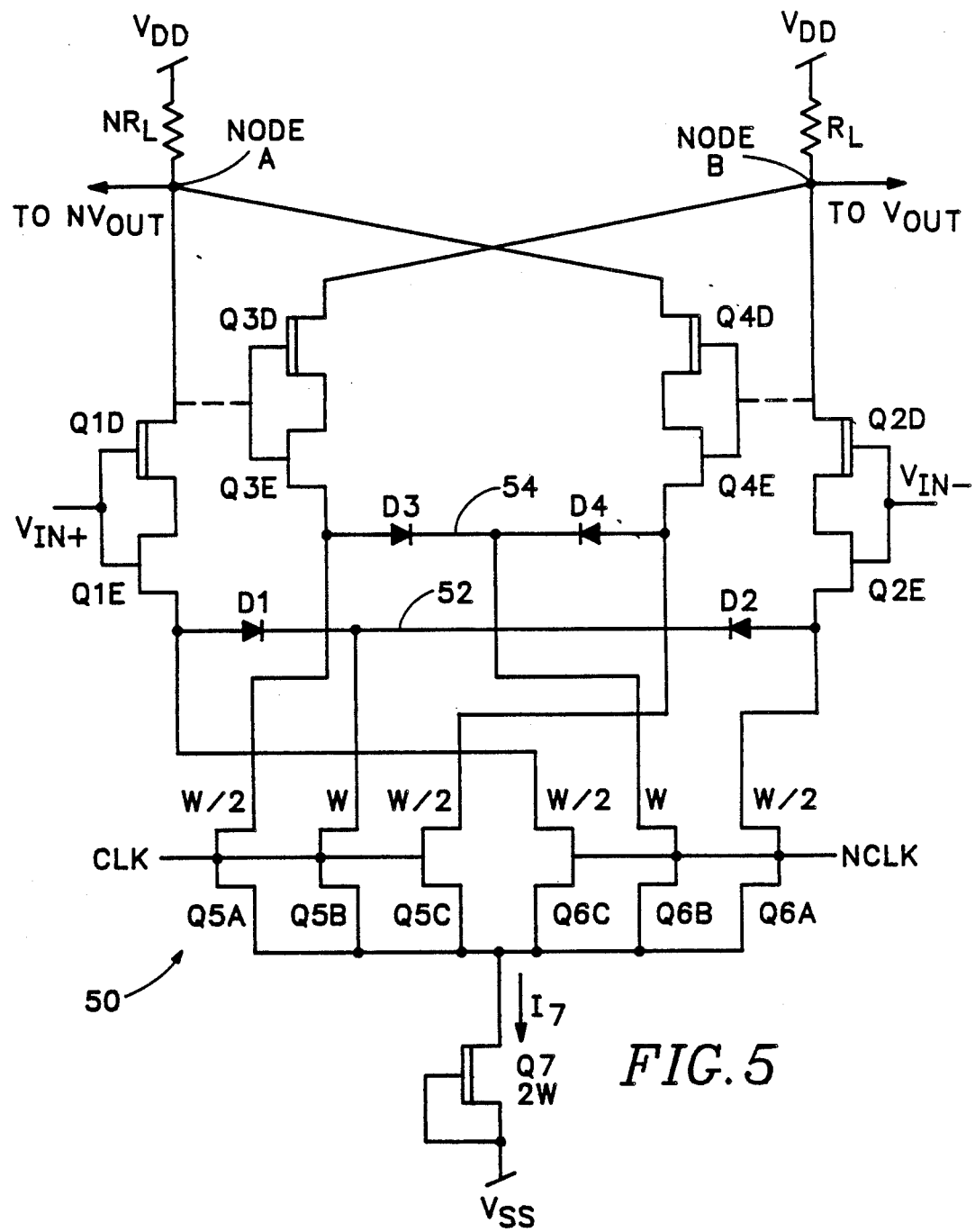
FIG. 5 shows the circuit that incorporates a differential-pair switching scheme topology of the present invention.

With reference to the topology illustrated in circuit 50 of FIG. 5, a significant amount of charge storage and resulting hysteresis occurs when an FET is completely turned off. Therefore, the amount of charge storage and hysteresis can be reduced by not turning transistors $Q_{1D,1E}$, $Q_{2D,2E}$, $Q_{3D,3E}$, and $Q_{4D,4E}$ completely off. Accordingly, circuit 50 of FIG. 5 illustrates a topology in which a differential pair ($Q_1$ and $Q_2$, or $Q_3$ and $Q_4$) is switched on and off without completely turning the transistors off.

As used herein, a differential pair ($Q_1$ and $Q_2$, or $Q_3$ and $Q_4$) is switched on when current flows through the branches 52 or 54 that connect the emitters or sources of the enhancement transistors of the differential pair. A differential pair is switched off when current does not flow through branches 52 or 54 because $Q_{5B}$ or $Q_{6B}$ is off. The topology illustrated in FIG. 5 allows current to flow through the transistors of the differential amplifier pair ($Q_1$, $Q_2$) and the differential regenerative pair ($Q_3$, $Q_4$) independent of whether current is flowing through leads 52 or 54 that connect the emitters or sources of the enhancement transistors of the pair.

Figure 8:
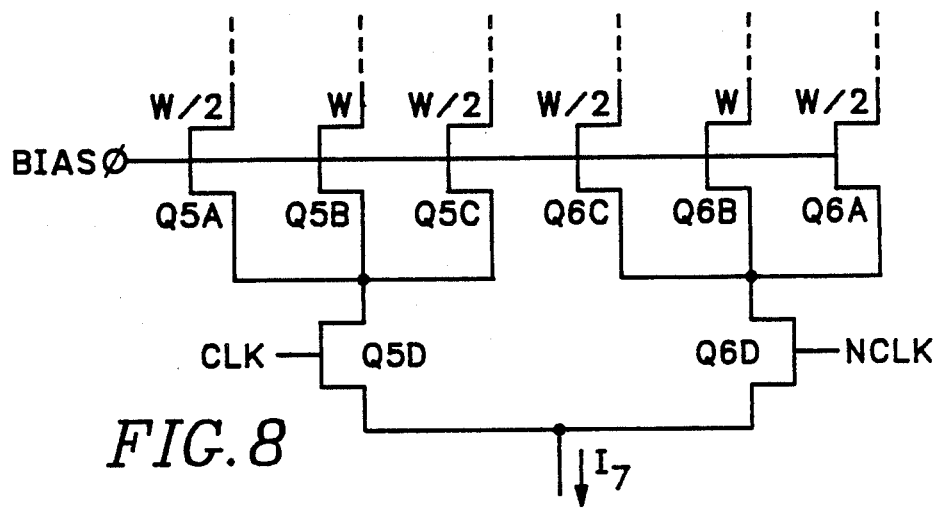
FIG. 8 shows an alternative embodiment of the circuit of FIG. 5.

This is accomplished by placing a first pair of diodes $D_1$ and $D_2$, in series between the sources of $Q_{1E}$ and $Q_{2E}$, and a second pair of diodes $D_3$ and $D_4$ in series between the sources of $Q_{3E}$ and $Q_{4E}$ of FIG. 5. The clock differential-pair of FIG. 5 comprises six FETs, $Q_{5A}$, $Q_{5B}$, and $Q_{5C}$, and $Q_{6A}$, $Q_{6B}$, and $Q_{6C}$. $Q_{5A}$-$Q_{5C}$ are driven by CLK, and $Q_{6A}$-$Q_{6C}$ are driven by NCLK. The junction of diodes $D_1$ and $D_2$ is connected to $Q_{5B}$, and the junction of diodes $D_3$ and $D_4$ is connected to $Q_{6B}$. An alternate embodiment of the clock switching scheme is shown in FIG. 8. The circuit of FIG. 8 employs individual transistors $Q_{5D}$ and $Q_{6D}$ as a differential pair controlled by CLK and NCLK and two weighted cascode networks $Q_{5A-C}$ and $Q_{6A-C}$ to properly distribute the ourrent streered by $Q_{5D}$, $Q_{6D}$.

When CLK is in the high state, current flows from the sources of $Q_{1E}$ and $Q_{2E}$ through diodes $D_1$ and $D_2$, and through $Q_{5B}$. Diodes $D_1$ and $D_2$ act as low-value resistors connecting $Q_{1E}$ and $Q_{2E}$. Current from the sources of $Q_{1E}$ and $Q_{2E}$ does not flow through $Q_{6C}$ and $Q_{6A}$, because they are off since NCLK is in the low state. Under these conditions, the gain $A_V$ of the $Q_{1D}$, $Q_{1E}$, $Q_{2D}$, $Q_{2E}$ differential stage is expressed in equation (1) below:

$$A_v = \frac{g_m R_L}{1 + 2g_m r_d(\text{on})} > 1 \quad (1)$$

where $g_m$ is the FET transconductance; $r_d(\text{on})$ is the diode on resistance; and $R_L$ is the drain load resistance. Equation (1) indicates that $A_v > 1$, if $R_L > 2r_d(\text{on})$, to first order approximation.

When CLK changes to the low state, current no longer flows through $Q_{5B}$. However, current then flows through $Q_{6A}$ and $Q_{6C}$. Therefore, when CLK changes to the low state, current flows from $Q_{1E}$ through $Q_{6C}$, rather than $D_1$ and $Q_{5B}$, and current flows from $Q_{2E}$ through $Q_{6A}$, rather than $D_2$ and $Q_{5B}$.

After CLK switches to the low state and current no longer flows through $Q_{5B}$, the gain $A_V$ of the differential pair $Q_1$ and $Q_2$ falls below unity because $r_d(\text{off})$ of the diodes in the off state is orders of magnitude greater than the value of $r_d(\text{on})$. The gain $A_V$, then, is shown in equation (2), below:

$$A_v(\text{off}) = \frac{g_m R_L}{1 + g_m r_d(\text{CLK})} << 1 \quad (2)$$

where $R_L << r_o(\text{CLK}) << r_o(\text{off})$, and $r_o(\text{CLK})$ is the output resistance of the clock differential pair devices $Q_{5A,5C}$ and $Q_{6A,6C}$.

Because the amplifier FETs are always carrying current, the variation of the device operating points between amplification and regeneration operating modes is minimized, leading to further reduction in hysteresis.

In FIG. 5, "w" refers to the relative FET gate widths. A transistor having a unit gate width w will carry twice the current as an otherwise identical transistor having a gate width w/2. The combined gate widths of the FETs receiving current from $Q_1$ and $Q_2$, and $Q_3$ and $Q_4$ remains constant as CLK changes state. When CLK is in the high state, the combined current of $Q_1$ and $Q_2$ flows into $Q_{5B}$, having a width w. When CLK is low, the current of $Q_1$ flows into $Q_{6C}$ having a width w/2, and the current of $Q_2$ flows into $Q_{6A}$, having a width w/2, together having a net width of w. Likewise, $Q_{6B}$ has a width w, and $Q_{5A}$ and $Q_{5C}$ have widths w/2, together having a net width of w.

Figure 6:
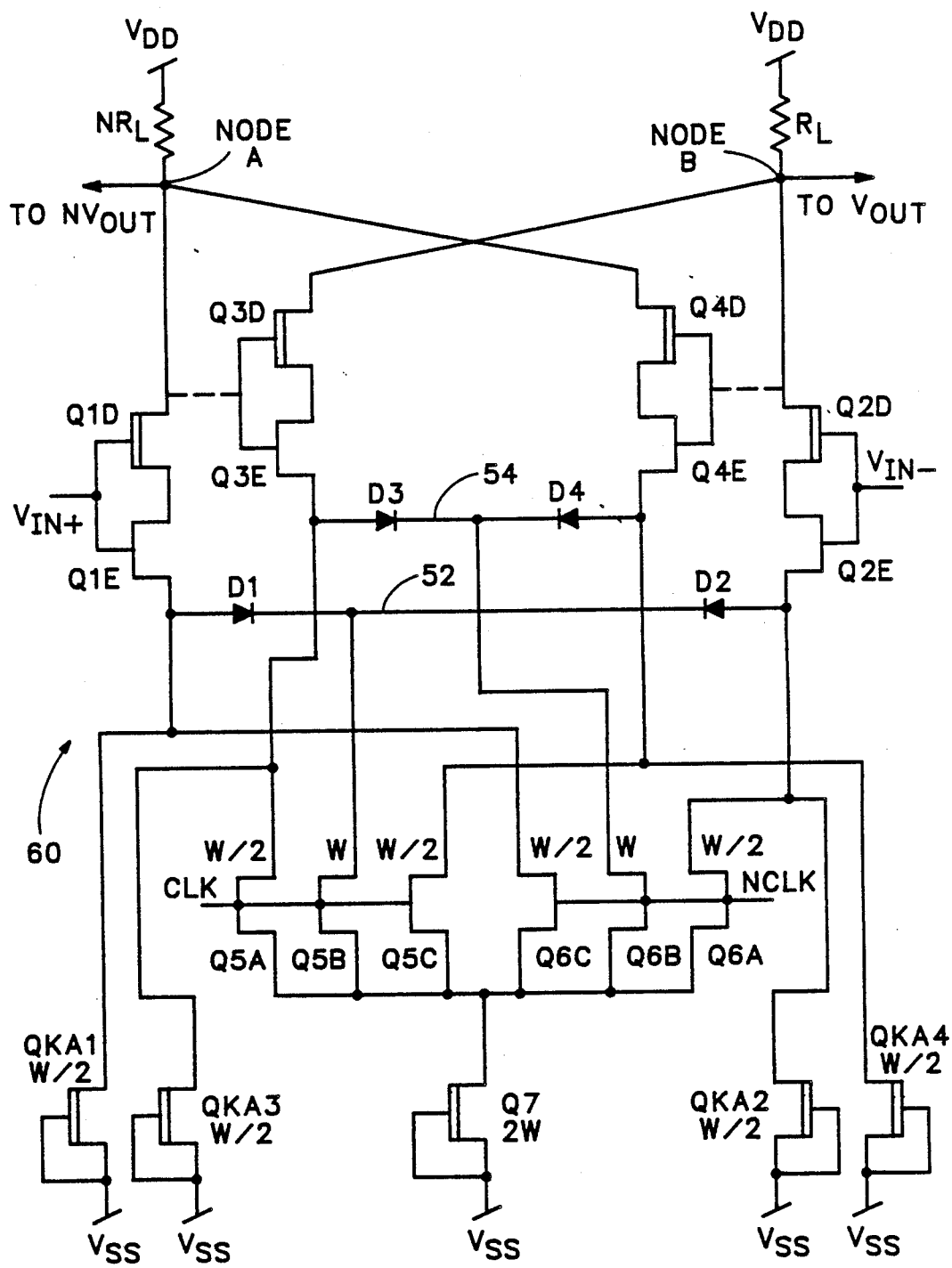
FIG. 6 shows the circuit topology of FIG. 5 implemented with keep-alive current sources.

Referring to FIG. 6, a third topology that is illustrated in circuit 60 that utilizes keep-alive currents from $Q_{KA1}$, $Q_{KA2}$, $Q_{KA3}$, and $Q_{KA4}$ to maintain at least some current in the amplifier pair ($Q_1$, $Q_2$) and the regenerative pair ($Q_3$, $Q_4$) during all of the comparator states. Without the keep-alive currents, one of the diodes $D_1$ or $D_2$ would turn off under the condition of a large input differential, that is, $V_{IN+} >> V_{IN-}$ or $V_{IN-} >> V_{IN+}$ in the case of the outer pair, or $V_{OUT} >> NV_{OUT}$ or $NV_{OUT} >> V_{OUT}$ in the case of the inner pair, which would in turn cause $Q_1$ or $Q_2$ and/or $Q_3$ or $Q_4$ to turn completely off.

FIG. 6 shows the circuit of FIG. 5 with keep-alive current sources $Q_{KA1}$-$Q_{KA4}$ that are connected directly to the source terminals of the amplifier transistors $Q_1$-$Q_4$. When the voltage supplied to one of the inputs $V_{in+}$ or $V_{in-}$ is much lower than the other, the associated diode $Q_1$ or $Q_2$ will be turned off, leaving only the keep-alive current flowing in $Q_1$ or $Q_2$. The device $Q_1$ or $Q_2$ then becomes a source follower, taking no part in amplification. Under such large signal conditions, however, the amplifier $Q_1$, $Q_2$ operates in a manner similar to that of switch, and the desired comparator action is not compromised. The keep-alive current is typically chosen to be one-quarter to one-third the value of the switched current.

The combined gate width of the FETs $Q_{5A}$-$Q_{5C}$, $Q_{6A}$-$Q_{6C}$ and $Q_{KA1}$-$Q_{KA4}$ that source current to $Q_1$-$Q_4$ remains constant in circuit 60 of FIG. 6 as CLK changes state as is explained above in connection with FIG. 5. When CLK is in the high state, the combined current from $Q_1$ and $Q_2$ flows into $Q_{5B}$, which has a gate width w, and $Q_{KA1}$ and $Q_{KA2}$, which each have gate widths w/2, making a combined total gate width 2w. When CLK is low, the combined current from $Q_1$ and $Q_2$ flows into $Q_{6C}$, $Q_{6A}$, $Q_{KA1}$, and $Q_{KA2}$, which each have gate widths w/2, and or a combined total gate of 2w. The total gate widths are likewise constant for $Q_3$ and $Q_4$. $Q_7$ has a gate width 2w.

Figure 1:
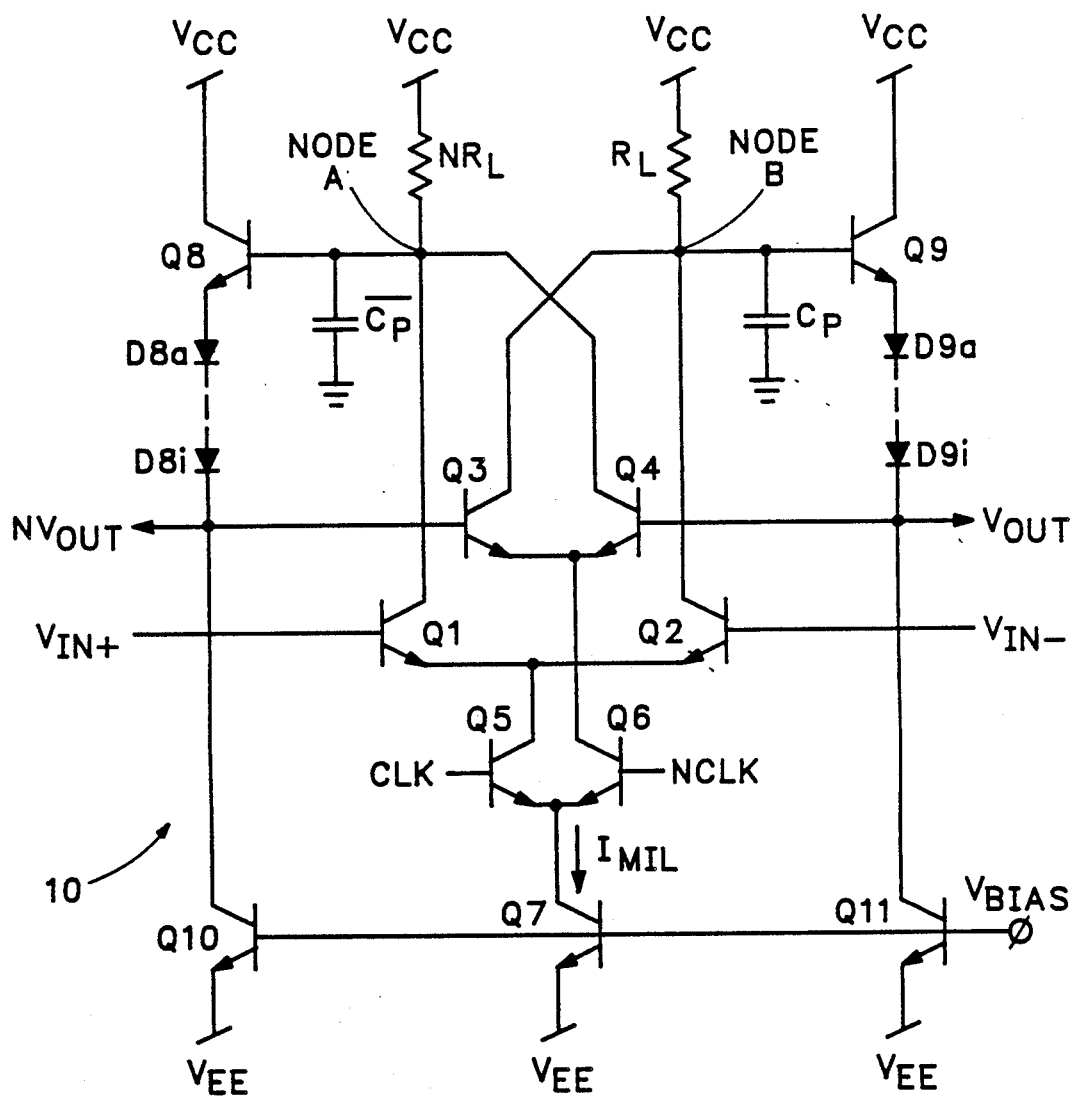
FIG. 1 shows a prior art latching comparator implementation with silicon bipolar transistors.
Figure 2:
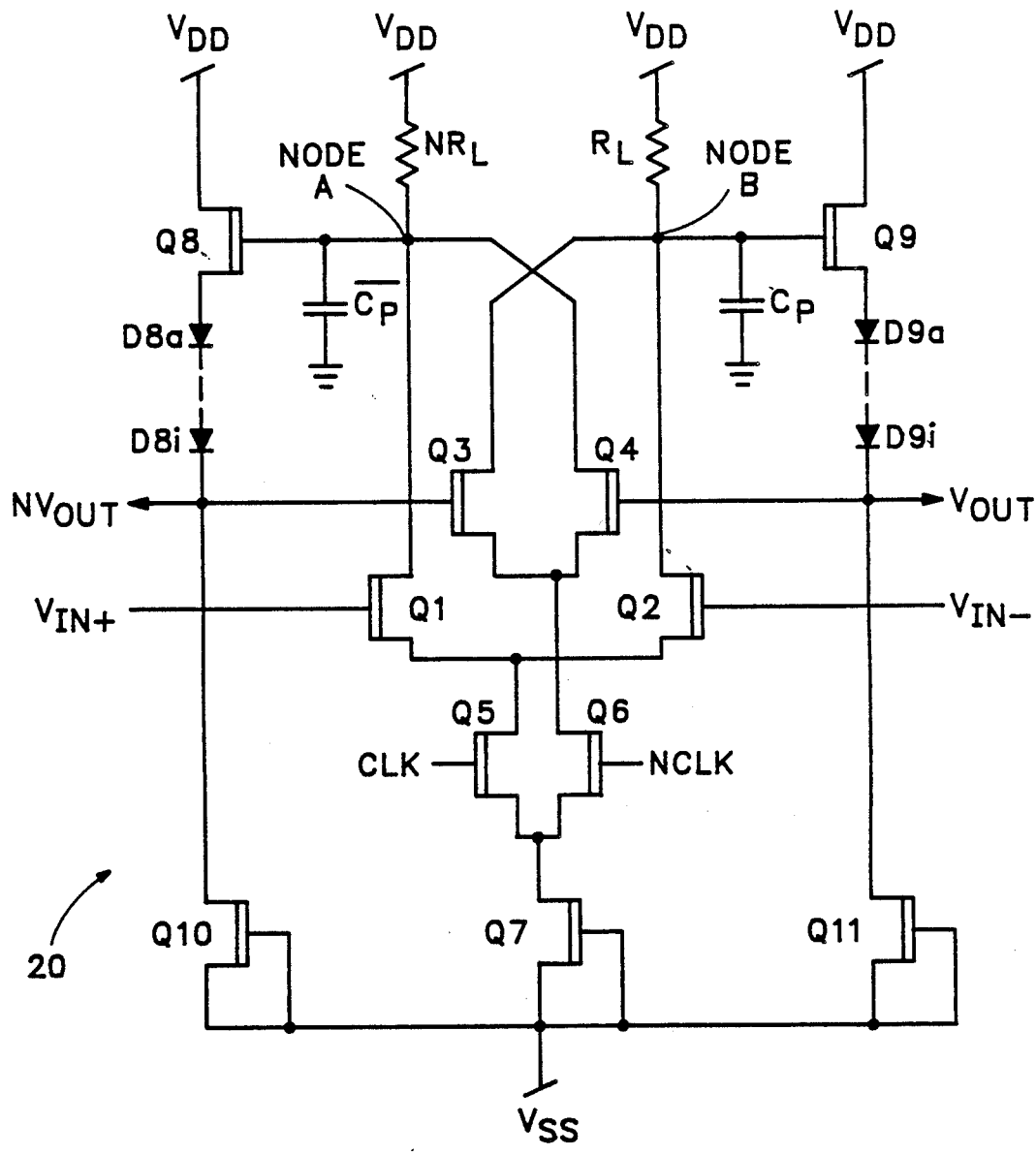
FIG. 2 shows a prior art latching comparator implemented with FETs.
Figure 3A:
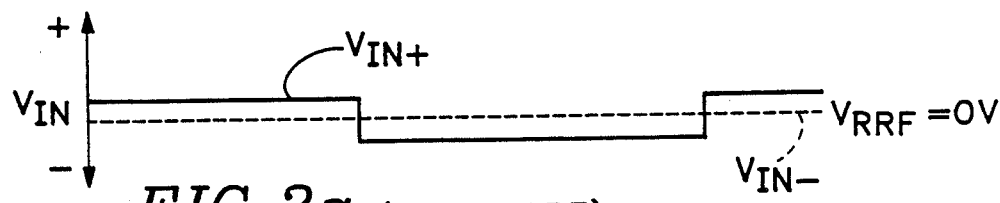
FIGS. 3a, 3b, and 3c show typical waveforms developed at certain nodes of the prior art circuits of FIGS. 1 and 2.
Figure 3B:
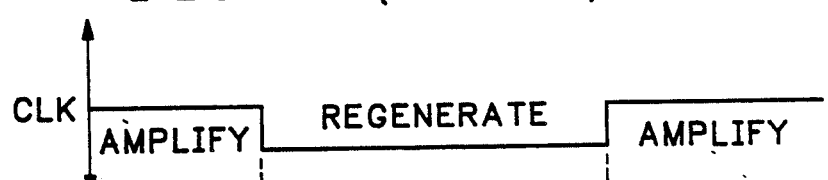
Figure 3C:
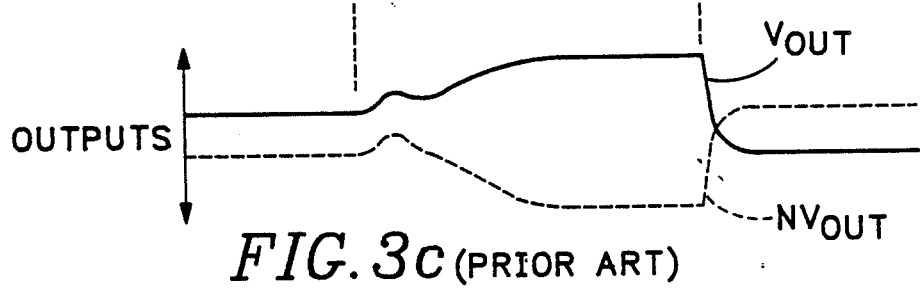

The presence of a constant minimum current flow in the differential pair transistors has the added advantage of minimizing the amount of time required to switch between amplify and non-amplify modes, since the "distance" the FET parasitics must be charged and discharged is smaller than in the case of the classical topologies of FIG. 1 and 2 which completely turn the differential pairs off.

Figure 7:
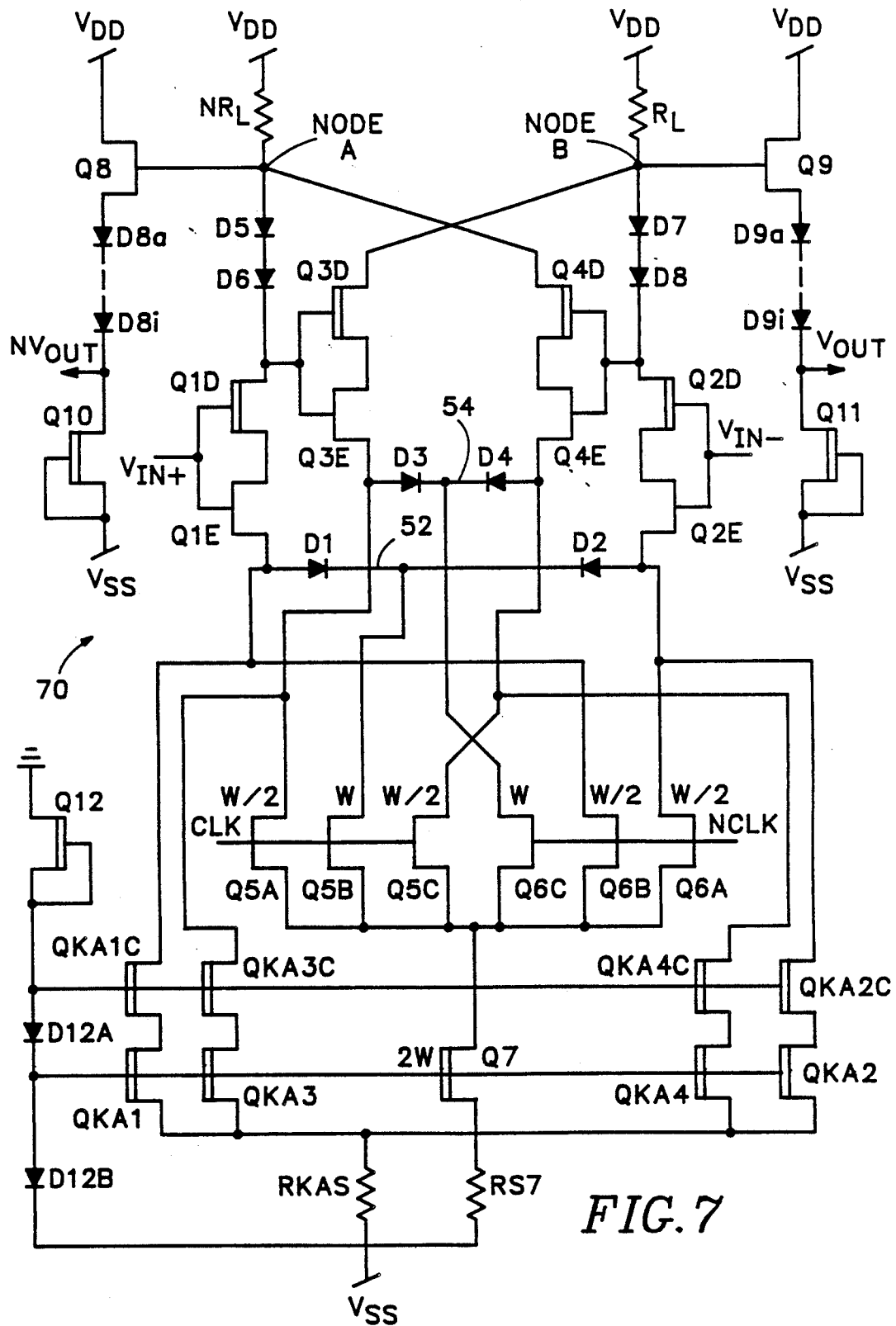
FIG. 7 shows a composite schematic of the present invention.

As noted above, the dashed lines in between the gate of Q3 and node A represent the subcircuit that includes Q8, D8a-8i, and Q10 of FIGS. 1 and 2, and the dashed lines in between the gate of Q and node B represent the subcircuit that includes Q9, D9a-9i, and Q11 of FIGS. 1 and 2. In FIG. 6, however, the dashed lines may also represent an integral level-shift scheme D5–D8, as shown in FIG. 7, which ensure that the inner latching differential pair Q3 and Q4 have adequate drain-source headroom. Because the current through the outer differential pair, Q1 and Q2, is never interrupted, level-shift diodes D5–D8 (see FIG. 7) remain forward-biased, providing a minimum-delay path for the regeneration differential pair, Q3 and Q4. The classical architectures of FIGS. 1 and 2 use source-follower buffers with level-shift networks, which introduce additional phase delay around the loop thereby slowing the regeneration response.

FIG. 7 shows the final composite latching comparator schematic, which incorporates all of the individual techniques described in connection with FIGS. 4–6. The components of FIG. 7 are identified by the same nomenclature that was used in FIGS. 4–6. In addition to the features of FIGS. 4–6, FIG. 7 also includes $Q_{KA1C}$-$Q_{KA4C}$ in cascode with $Q_{KA1}$-$Q_{KA4}$, to increase the output resistance of $Q_{KA1}$, and resistor $R_{KAS}$ and $R_{S7}$ to provide source degeneration for current source stability. Bias network $Q_{12}$, $D_{12A}$, and $D_{12B}$ provide gate bias for $Q_7$, $Q_{KA1-4}$, and $Q_{KA1-4}$.

The techniques of the present invention minimize the impact of MESFET charge storage and allow increased resolution and operating speed in comparators and amplifiers. The techniques may be used alone or in combination with each other. The techniques make the regenerative comparator suitable for use in A/D converters requiring large numbers of comparators.

It would be obvious to those skilled in the art that many changes may be made in the above described details of the preferred embodiment of the present invention without departing from the underlying principles thereof. The scope of the present invention should be determined, therefore, only by the following claims.

Concerning the claims, the words "first," "second," "third," and "fourth" are intended only as symbols and not numerical values. For example, the phrase "fourth transistor in a set" does not mean that there are a first, second, or third transistor in the set.

I claim:

1. A regenerative comparator, comprising:
    a differential amplifier pair of first and second sets of transistors, each set of the pair including a first transistor having a drain, a source, a gate, and a first dimension value and a second transistor having a drain, a source, a gate, and a second dimension value, the first transistor being a depletion mode transistor, the second transistor being an enhancement mode transistor, the gates of the first and second transistors of each set being coupled together to receive a differential input voltage, the drains of the first transistor of each set forming a differential current output, the source of the first transistor being coupled to the drain of the second transistor in a bootstrap cascode arrangement, the sources of the second transistor of each set being coupled together at a first source node, and the magnitudes of the first and second dimension values being selected such that the drain-to-source voltage of the second transistor is limited by the first transistor to a predetermined value and is isolated from large voltage variations at the drain of the first transistor;
    a differential regenerative pair of first and second sets of transistors, each set of the pair including a third transistor having a drain, a source, a gate, and a third dimension value and a fourth transistor having a drain, a source, a gate, and a fourth dimension value, the third transistor being a depletion mode transistor, the fourth transistor being an enhancement mode transistor, the gates of the third and fourth transistors of each set being coupled together and to the drain of the respective first transistor, the drains of the third transistor of each set being cross-coupled to the differential current output, the source of the third transistor being coupled to the drain of the fourth transistor in a bootstrap cascode arrangement, the sources of the fourth transistor of each set being coupled together at a second source node, and the magnitudes of the third and fourth dimension values being selected such that the drain-to-source voltage of the fourth transistor is limited by the third transistor to a predetermined value and is isolated from large voltage variations at the drain of the third transistor; and
    clock means having a first output coupled to the first source node and a second output coupled to the second source node for switching between a first state and a second state, during the first state the differential amplifier pair of transistors is on and the differential regenerative pair of transistor is off, and during the second state the differential amplifier pair of transistors is off and the differential regenerative pair of transistors is on.

2. The regenerative comparator of claim 1, wherein the first and second dimension values are gate width.

3. The regenerative comparator of claim 1, further comprising:
    first differential-pair source coupling means having first and second inputs interposed between the source of one of the second transistors and the source of the other second transistor, and a center node;
    second differential-pair source coupling means having first and second inputs interposed between the source of one of the fourth transistors and the source of the other fourth transistor, and a center node;
    the first output of the clock means having three current outputs respectively coupled to the center node of the first differential-pair source coupling means and the first and second inputs of the second differential-pair source coupling means; and
    the second output of the clock means having three current outputs respectively coupled to the center node of the second differential-pair source coupling means and the first and second inputs of the first differential-pair source coupling means
    for allowing current to flow through the transistors of the amplifier pair independent of whether the amplifier pair is on and for allowing current to flow through the transistors of the regenerative pair independent of whether the regenerative pair is on.

4. The regenerative comparator of claim 1, further comprising keep-alive current source means having a first current output coupled to the first source node and a second current output coupled to the second source node for allowing current to flow through the amplifier pair independent of a magnitude of a difference input voltages being compared by the amplifier pair and allowing current to flow through the regenerative pair independent of a magnitude of a difference in input voltages being compared by the regenerative pair.

5. The regenerative comparator of claim 3, further comprising keep-alive current source means having first and second current outputs respectively coupled to the first and second inputs of the first differential-pair source coupling means and third and fourth current outputs respectively coupled to the first and second inputs of the second differential-pair source coupling means for allowing current to flow through the amplifier pair independent of a magnitude of a difference input voltages being compared by the amplifier pair and allowing current to flow through the regenerative pair independent of a magnitude of a difference in input voltages being compared by the regenerative pair.

6. A regenerative comparator, comprising:
   a differential amplifier pair of transistors having first and second source nodes, a differential input for receiving a differential voltage, and a differential output for providing a differential output current;
   a differential regenerative pair of transistors having third and fourth source nodes, a differential input coupled to the differential output of the differential amplifier pair of transistors, and a differential output cross-coupled to the differential output of the differential amplifier pair of transistors;
   clock means having a first output coupled to the first and second source nodes and a second output coupled to the third and fourth source nodes for switching between a first state and a second state, during the first state the differential amplifier pair of transistors is on and the differential regenerative pair of transistors is off, and during the second state the differential amplifier pair of transistors is off and the differential regenerative pair of transistors is on;
   first differential-pair source coupling means interposed between the first and second source nodes, the first differential-pair source coupling means including a center node;
   second differential-pair source coupling means interposed between the third and fourth source nodes, the second differential-pair source coupling means including a center node;
   the first input of the clock means having three current outputs respectively coupled to the center node of the first differential-pair source coupling means and the third and fourth source nodes; and
   the second output of the clock means having three current outputs respectively coupled to the center node of the second differential-pair source coupling means and the first and second source nodes for allowing current to flow through the transistors of the amplifier pair independent of whether the amplifier pair is on and for allowing current to flow through the transistors of the regenerative amplifier pair independent of whether the regenerative pair is on.

7. The regenerative comparator of claim 6, wherein the first differential-pair source coupling means comprises:
   two diodes each having an anode and a cathode, the cathodes being coupled together to form the center node, one anode being coupled to first source node and the other anode being coupled to the second source node.

8. The regenerative comparator of claim 6, further comprising keep-alive current source means having first, second, third, and fourth current outputs respectively coupled to the first, second, third, and fourth source nodes for allowing current to flow through the amplifier pair independent of a magnitude of a difference in input voltages being compared by the amplifier pair and allowing current to flow through the regenerative pair independent of a magnitude of a difference in input voltage being compared by the regenerative pair.

9. The regenerative comparator of claim 6, wherein the differential amplifier pair of transistors is a pair of a set of transistors, each set of the pair including a first transistor having a drain, a source, a gate, and a first dimension value and a second transistor having a drain, a source, a gate, and a second dimension value, the first transistor being a depletion mode transistor wherein the drain is coupled to a first voltage source, the second transistor being an enhancement mode transistor, the gates of the first and second transistors being coupled together to receive an input voltage, the source of the first transistor being coupled to the drain of the second transistor in a bootstrap cascode arrangement, the sources of the second transistor of each set forming the first and second source nodes and the magnitudes of the first and second dimension values being selected such that the drain-to-source voltage of the second transistor is limited by the first transistor to a predetermined value and is isolated from large voltage variations at the first voltage source, whereby hysteresis in the amplifier pair due to charge storage is significantly reduced.

10. The regenerative comparator of claim 6, wherein the second differential-pair source coupling means comprises:
    two diodes each having an anode and a cathode, the cathodes being coupled together to form the center node, one anode being coupled to third source node and the other anode being coupled to the fourth source node.

11. The regenerative comparator of claim 6, wherein the three current outputs of the first clock means output comprise:
    a first current output coupled to the center node of the first differential-pair source coupling means;
    a second current output coupled to the third source node; and
    a third current output coupled to the fourth source node,
    the second and third current outputs providing equal amounts of current and the first current output providing a current equal to twice that of one of the first and second current outputs.

12. The regenerative comparator of claim 6, wherein the three current outputs of the second clock means output comprise:
    a first current output coupled to the center node of the second differential-pair source coupling means;
    a second current output coupled to the first source node; and
    a third current output coupled to the second source node,
    the second and third current outputs providing equal amounts of current and the first current output providing a current equal to twice that of one of the first and second current outputs.

13. A regenerative comparator, comprising:

a differential amplifier pair of transistors having first and second source nodes, a differential input for receiving a differential voltage, and a differential output for providing a differential output current;

a differential regenerative pair of transistors having third and fourth source nodes, a differential input coupled to the differential output of the differential amplifier pair of transistors, and a differential output cross-coupled to the differential output of the differential amplifier pair of transistors;

clock means having a first output coupled to the first and second source nodes and a second output coupled to the third and fourth source nodes for switching between a first state and a second state, during the first state the differential amplifier pair of transistors is on and the differential regenerative pair of transistors is off, and during the second state the differential amplifier pair of transistors is off and the differential regenerative pair of transistors is on; and keep-alive current source means having a first current output coupled to the first source node and a second current output coupled to the second source node for allowing current to flow through the amplifier pair independent the magnitude of a difference in input voltages being compared by the amplifier pair and allowing current to flow through the regenerative pair independent of a magnitude of a difference in input voltages being compared by the regenerative pair.

14. The regenerative comparator of claim 13, wherein the differential amplifier pair of transistors is a pair of a set of transistors, each set of the pair including a first transistor having a drain, a source, a gate, and a first dimension value and a second transistor having a drain, a source, a gate, and a second dimension value, the first transistor being a depletion mode transistor wherein the drain is coupled to a first voltage source, the second transistor being an enhancement mode transistor, the gates of the first and second transistors being coupled together to receive an input voltage, the source of the first transistor being coupled to the drain of the second transistor in a bootstrap cascode arrangement, the sources of the second transistor of each set forming the first and second source nodes and the magnitudes of the first and second dimension values being selected such that the drain-to-source voltage of the second transistor is limited by the first transistor to a predetermined value and is isolated from large voltage variations at the first voltage source, whereby hysteresis in the amplifier pair due to charge storage is significantly reduced.

15. The regenerative comparator of claim 13, further comprising:
   first differential-pair source coupling means interposed between the first and second source nodes, the first differential-pair source coupling means including a center node;
   second differential-pair source coupling means interposed between the third and fourth source nodes, the second differential-pair source coupling means including a center node;
   the first output of the clock means having three current outputs respectively coupled to the center node of the first differential-pair source coupling means and the third and fourth source nodes; and
   the second output of the clock means having three current outputs respectively coupled to the center node of the second differential-pair source coupling means and the first and second source nodes for allowing current to flow through the transistors of the amplifier pair independent of whether the amplifier pair is on and for allowing current to flow through the transistors of the regenerative amplifier pair independent of whether the regenerative pair is on.

16. The regenerative comparator of claim 13, wherein the keep-alive current source means includes first, second, third, and fourth current outputs respectively coupled to the first, second, third, and fourth source nodes for allowing current to flow through the amplifier pair independent of a magnitude of a difference in input voltages being compared by the amplifier pair and allowing current to flow through the regenerative pair independent of a magnitude of a difference in input voltage being compared by the regenerative pair.

17. The regenerative comparator of claim 15, wherein the first differential-pair source coupling means comprises:
   two diodes each having an anode and a cathode, the cathodes being coupled together to form the center node, one anode being coupled to first source node and the other anode being coupled to the second source node.

18. The regenerative comparator of claim 15, wherein the second differential-pair source coupling means comprises:
   two diodes each having an anode and a cathode, the cathodes being coupled together to form the center node, one anode being coupled to third source node and the other anode being coupled to the fourth source node.

19. The regenerative comparator of claim 15, wherein the three current outputs of the first clock means output comprise:
   a first current output coupled to the center node of the first differential-pair source coupling means;
   a second current output coupled to the third source node; and
   a third current output coupled to the fourth source node,
   the second and third current outputs providing equal amounts of current and the first current output providing a current equal to twice that of one of the first and second current outputs.

20. The regenerative comparator of claim 15, wherein the three current outputs of the second clock means outputs comprise:
   a first current output coupled to the center node of the second differential-pair source coupling means;
   a second current output coupled to the first source node; and
   a third current output coupled to the second source node,
   the second and third current outputs providing equal amounts of current and the first current output providing a current equal to twice that of one of the first and second current outputs.

21. The regenerative comparator of claim 1, 6, or 13 wherein each of the transistors is a gallium arsenide (GaAs) metal semiconductor field effect transistor (MESFET).

* * * * *